United States Patent
Matsumura et al.

(10) Patent No.: US 7,487,586 B2
(45) Date of Patent: Feb. 10, 2009

(54) PROCESS FOR PRODUCING SEMICONDUCTOR DEVICE

(75) Inventors: Akiko Matsumura, Ibaraki (JP); Yuji Hotta, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 939 days.

(21) Appl. No.: 10/737,853

(22) Filed: Dec. 18, 2003

(65) Prior Publication Data

US 2004/0123456 A1    Jul. 1, 2004

(30) Foreign Application Priority Data

Dec. 18, 2002    (JP) ............ P. 2002-366910

(51) Int. Cl.
*H05K 3/30* (2006.01)

(52) U.S. Cl. .............. 29/841; 29/830; 29/832; 29/840; 156/230

(58) Field of Classification Search .......... 29/840, 29/830, 832, 841; 156/64, 230, 247, 250, 156/289
See application file for complete search history.

(56) References Cited

U.S. PATENT DOCUMENTS 5,757,078 A * 5/1998 Matsuda et al. ............. 257/737
6,652,688 B2 * 11/2003 Matsumura et al. ........... 156/64

FOREIGN PATENT DOCUMENTS

| JP | 2000-208547 A | 7/2000 |
| JP | 2003-077944 A | 3/2003 |
| WO | WO 02/24391 A1 | 3/2002 |

* cited by examiner

*Primary Examiner*—Rick K Chang
(74) *Attorney, Agent, or Firm*—Sughrue Mion, PLLC

(57) ABSTRACT

A process for semiconductor device production by which the reliability of connection with bumps can be easily heightened with higher certainty. The process for producing a semiconductor device comprising a substrate having bumps formed thereon, comprises covering the bumps with an adhesive film which has a modulus of elasticity (−55° C.) of from 100 MPa to 5 GPa and has a thickness corresponding to from 5 to 40% of the height of the bumps, and then disposing the adhesive film on the substrate so that the bumps pierce through the adhesive film and come to protrude therefrom.

5 Claims, 1 Drawing Sheet

PROCESS FOR PRODUCING SEMICONDUCTOR DEVICE

FIELD OF THE INVENTION

The present invention relates to a process for producing a semiconductor device having bumps as external terminals.

BACKGROUND OF THE INVENTION

In semiconductor devices such as CSP's and BGA's, bumps have hitherto been used as terminals for mounting on circuit boards such as mother boards and daughter boards. Techniques which have been employed for improving the reliability of connection with the bumps include a method in which a resin is applied only to around the bottoms of bumps to reinforce the bumps (referrence 1) and a method in which a bump-reinforcing film having holes formed beforehand in areas where bumps are to be located is applied to a circuit board before bumps are formed thereon (reference 2).

Reference 1: WO 02/24391
Reference 2: JP-A-2000-208547

However, in the former method, there is a possibility that the resin might be applied unevenly because of the pitch and positions of bumps, etc. In the areas in which the resin has been applied in an insufficient amount, a deficiency in reinforcement results to cause unevenness in the improvement of connection reliability. In addition, there is a problem that the production steps are complicated and this increases the cost of semiconductor devices.

In the latter method, it is necessary to form through-holes beforehand in a reinforcing sheet according to the positions and size of bumps. There is hence a possibility that connection reliability might be adversely influenced by the shape and positions of the through-holes formed. Furthermore, there is a problem that the production steps are complicated, resulting in an increased cost.

SUMMARY OF THE INVENTION

An object of the invention is to provide a process for semiconductor device production by which the reliability of connection with bumps can be easily heightened with higher certainty.

In order to eliminate the problems described above, the invention provides a process for producing a semiconductor device comprising a substrate having bumps formed thereon, which comprises covering the bumps with an adhesive film which has a modulus of elasticity (−55° C.) of from 100 MPa to 5 GPa and has a thickness of from 5 to 40% of the height of the bumps, and then disposing the adhesive film on the substrate so that the bumps pierce through the adhesive film and come to protrude therefrom.

BRIEF DESCRIPTION OF THE DRAWINGS

By way of example and to make the description more clear, reference is made to the accompanying drawing in which.

DESCRIPTION OF THE REFERENCE NUMERALS

Figure 1:
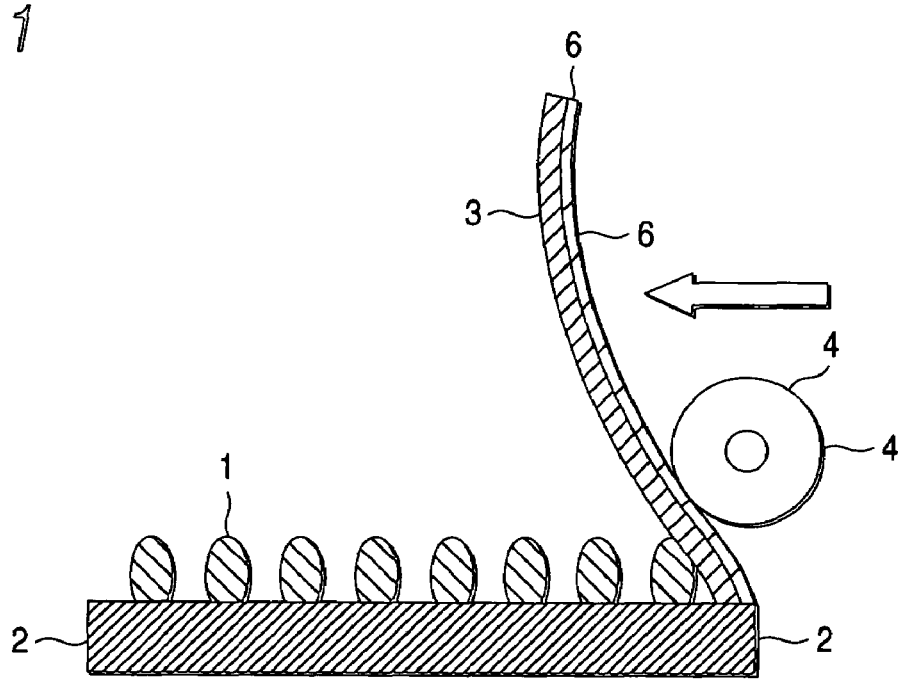
FIG. 1 is a diagrammatic sectional view illustrating a method of laminating an adhesive film to a substrate in one embodiment of the process for semiconductor device production according to the invention.

1: solder bump
2: substrate
3: adhesive film
4: roller
5: semiconductor element
6: release film
10: semiconductor device

DETAILED DESCRIPTION OF THE INVENTION

According to this process for semiconductor device production, there is no need of forming through-holes beforehand in the adhesive film because the bumps pierce through the adhesive film and come to protrude therefrom. Consequently, a semiconductor device can be produced through simple production steps. Furthermore, since the bumps are caused to protrude from the adhesive film, this adhesive film is prevented from exerting an adverse influence in electrically connecting the bumps to a circuit board. The reliability of connection with bumps can hence be improved without fail.

In the process for semiconductor device production of the invention, the adhesive film preferably comprises a thermosetting resin composition. More preferably, the thermosetting resin composition is a polycarbodiimide resin composition.

When the adhesive film is made of a thermosetting resin composition, the film which is being adhered to the substrate can be in a relatively soft state and, hence, it is easy to cause the bumps to pierce through the adhesive film. Furthermore, since the bumps come into the state of being in intimate contact with the adhesive film, the bumps can be reinforced with higher certainty. In addition, the adhesive film can be cured simultaneously with reflow in a mounting step, whereby simplification of production steps also can be attained.

When the thermosetting resin composition is a polycarbodiimide resin composition, reliability after bonding can be improved because the cured resin has a low water absorption.

The invention further provides the process for semiconductor device production in which the adhesive film is to be cured simultaneously with the bonding of the bumps to a circuit board through reflow.

According to this process for semiconductor device production, there is no need of newly adding a step for curing the adhesive film. Simplification of production steps is hence attained.

An example of the embodiments for carrying out the invention will be explained below in detail by reference to the drawings.

Figure 2:
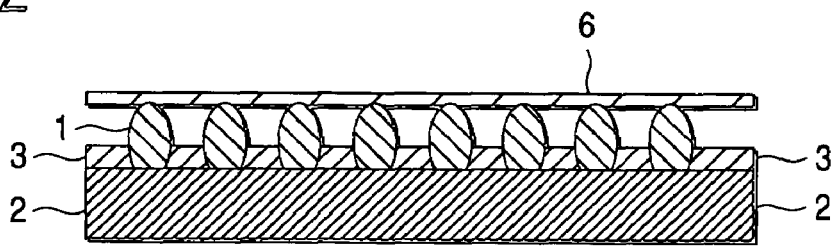
FIG. 2 is a diagrammatic sectional view illustrating the adhesive film laminated to the substrate in one embodiment of the process for semiconductor device production according to the invention.
Figure 3:
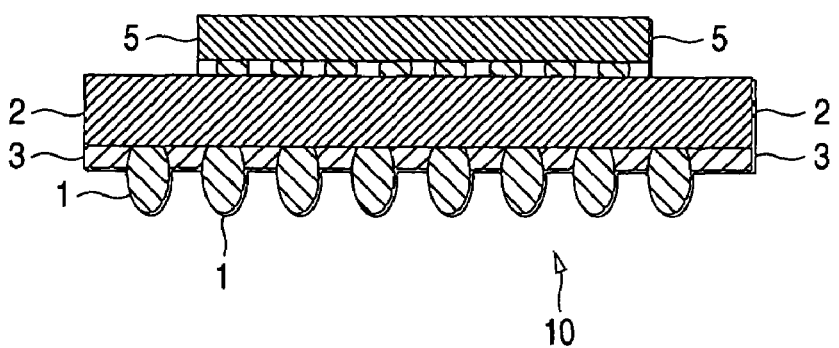
FIG. 3 is a diagrammatic sectional view illustrating a semiconductor device which has been produced by one embodiment of the semiconductor device production according to the invention and has a semiconductor element mounted thereon on the side opposite to the bumps.

FIGS. 1 to 3 are diagrammatic sectional views illustrating one embodiment of the process for semiconductor device production according to the invention. In this embodiment, an adhesive film 3 is first placed over a substrate 2 having solder bumps 1 formed thereon in given positions and then laminated thereto by heating and pressing the adhesive film 3 with a roller 4, as shown in FIG. 1. The adhesive film 3 is pressed against the solder bumps 1 with the roller 4. As a result, the solder bumps 1 pierce through the adhesive film 3 and come to protrude therefrom as shown in FIG. 2.

Thereafter, a semiconductor element 5 is mounted on the substrate 2 on the side opposite to the solder bumps 1 as shown in FIG. 3. Thus, a semiconductor device 10 bearing an adhesive film for solder bump reinforcement is obtained.

In the case of using an adhesive film 3 having a release film 6 laminated thereto on the front side, i.e., the side opposite to the substrate 2, as in the embodiment shown in FIG. 1, the roller 4 presses this adhesive film 3 through the release film 6 to bond the film 3 to the substrate 2.

In mounting the resultant semiconductor device 10 on a circuit board (not shown), the release film 6 is removed first. The semiconductor device 10 is then placed on the circuit board in such a manner that the solder bumps 1 come into contact with the circuit board. Thereafter, the solder bumps 1 are bonded to the circuit board by reflow (e.g., by preliminary heating at 150° C. for 50 seconds and subsequent heating at 260° C. for 10 seconds)

Heating temperatures in laminating the adhesive film 3 are not particularly limited. It is, however, preferred to use a temperature at which the adhesive film can be provisionally bonded to the substrate. For example, in the case where the adhesive film 3 is made of a thermosetting resin composition, the heating is conducted at a temperature of preferably from room temperature (e.g., 25° C.; this applies hereinafter) to 150° C., more preferably from 40 to 120° C.

Heating techniques also are not particularly limited. Use can be made, for example, of a method in which the substrate 2 is heated, besides the method in which the roller 4 is heated as in this embodiment.

Pressures in the laminating also are not particularly limited, and use may be made of conditions under which the solder bumps 1 pierce through at least the adhesive film 3 and come to protrude therefrom while being prevented from deforming. For example, in the case where the adhesive film 3 is made of a polycarbodiimide resin composition, the pressure is preferably from 0.1 to 30 g/bump, more preferably from 5 to 25 g/bump.

The modulus of elasticity (−55° C.) of the adhesive film is preferably from 100 MPa to 5 GPa, more preferably from 150 MPa to 3 GPa. Moduli of elasticity (−55° C.) thereof lower than 100 MPa are undesirable because such an adhesive film is so flexible that it has poor applicability in the laminating step. On the other hand, moduli of elasticity thereof exceeding 5 GPa are undesirable because it is difficult to cause the bumps to pierce through this adhesive film, resulting in an adverse influence on connection reliability, or because there is a possibility that the reinforcement of the bumps at the roots thereof might be insufficient.

The term modulus of elasticity (−55° C.) as used herein means the dynamic storage modulus as provided for in JIS K 7198 "Testing method for dynamic mechanical properties of plastics by non-resonant, forced, fixed frequency oscillation". Specifically, dynamic viscoelasticity testing apparatus DMS 210 (manufactured by Seiko Instruments) was used to determine the modulus by the tensile vibration method.

The measurement was conducted under the conditions of a test piece width of 1 cm, chuck-to-chuck distance of 20 mm, frequency of 10 Hz, and heating rate of 10° C./min.

The adhesive film to be used in the invention has the highest modulus of elasticity at a low temperature (−55° C.) in a TCT test, which is used for reliability evaluation. Because of this, the modulus of elasticity determined at a test temperature of −55° C. was employed. More specifically, the TCT test was carried out in accordance with JIS C0025. The test sample was subjected to a cycle of at −55° C. for 30 minutes, at room temperature for 5 minutes, at 125° C. for 30 minutes and at room temperature for 5 minutes, and this cycle was repeated.

The thickness of the adhesive film is preferably from 5 to 40%, more preferably from 10 to 30%, of the height of the bumps. Use of the adhesive film having such a thickness has the effect of enabling the bumps to be reinforced at the roots thereof with higher certainty without inhibiting electrical connections between electrodes for connection.

It is preferred that a release film be kept adherent to the front side of the adhesive film, i.e., the side opposite to the substrate, as in the embodiment described above. The presence of the release film not only prevents dust particles and the like from adhering to the surface of the adhesive film until use, but also reinforces the adhesive film to facilitate transportation and laminating to the substrate.

(Adhesive Film)

The material of the adhesive film to be used in the invention is not particularly limited as long as it is an insulating material capable of sticking to the substrate. A thermosetting resin composition, thermoplastic resin composition, or the like may be used. Preferred of these is a thermosetting resin composition because it has a low viscosity in a molten state and comes to have high heat resistance. Use of an adhesive film having a low viscosity in a molten state has an advantage that it is less apt to exert an adverse influence on the reliability of bump connection because the bumps readily pierce through this adhesive film and come to protrude therefrom.

Examples of the thermosetting resin composition include polyester resins, polyamide resins, polycarbodiimide resins, phenolic resins, epoxy resins, acrylic resins, and saturated polyester resins. Preferred of these are polycarbodiimide resins because these resins impart satisfactory storability to the adhesive film.

Polycarbodiimide copolymers represented by the following formula (1) can, for example, be used.

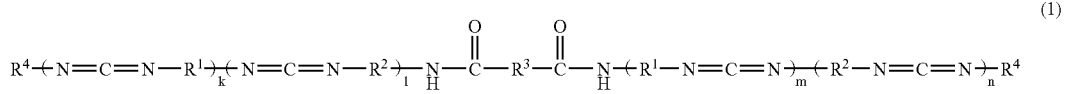

(1)

(In formula (1), k, l, m, and n each represent an integer of 1 to 30; $R^1$ and $R^2$ each represent an organic diisocyanate residue; $R^3$ represents a synthetic rubber residue; and $R^4$ represents an organic monoisocyanate residue.)

A polycarbodiimide copolymer such as one represented by formula (1) is produced preferably in the following manner. First, a bifunctional liquid rubber having a carboxyl group at each end is reacted with an organic diisocyanate to obtain a polyamide. Subsequently, carbodiimide formation is conducted through the reaction of the terminal isocyanate groups of the polyamide with an organic diisocyanate in the presence of a catalyst for carbodiimide formation. Thereafter, the ends of the resultant polymer are blocked with an organic monoisocyanate to obtain a polycarbodiimide copolymer.

More specifically, the bifunctional liquid rubber is reacted with at least 2 mol, preferably from 4 to 80 mol, more preferably from 5 to 50 mol, of an organic diisocyanate per mol of the rubber in the presence of a catalyst at generally from 0 to 120° C., preferably from 20 to 100° C., for about from 1 minute to 5 hours. The point of time when almost all of the hydroxyl groups have been eliminated from the system is taken as the end point of the reaction for yielding a polyamide terminated by NCO at each end.

Subsequently, this polyamide is reacted with an organic diisocyanate present in excess in the system in the presence of a catalyst for carbodiimide formation at generally from 40 to 150° C., preferably from 50 to 140° C. Thus, a polycarbodiimide copolymer represented by formula (1) can be obtained.

The amount of the organic diisocyanate necessary for this reaction is at least 2 mol per mol of the polyamide. The organic diisocyanate may be additionally introduced at this reaction stage or may be one which has been present since an initial stage of the reactions. The end blocking with an organic monoisocyanate is preferably conducted by adding the organic monoisocyanate in an initial, middle, or final stage of the polycarbodiimide formation or throughout the formation.

The end point of the reaction can be ascertained by IR spectroscopy from the occurrence of absorption attributable to carbodiimide groups (2,140 cm$^{-1}$) and the disappearance of absorption attributable to isocyanate groups (2,280 cm$^{-1}$).

(Bifunctional Liquid Rubber Having Carboxyl Group at Each End)

As the bifunctional liquid rubber having a carboxyl group at each end can be used, for example, a liquid polybutadiene (e.g., "Hycar CTB" (trade mark) manufactured by Ube Industries), liquid polybutadiene-acrylonitrile copolymer (e.g., "Hycar CTBN" (trademark) manufactured by Ube Industries), liquid polyisoprene (e.g., Kuraprene LIR-403 (trademark) manufactured by Kuraray), or liquid hydrogenated polyisoprene. Modifications of these can also be used.

(Organic Diisocyanate)

In formula (1), $R^1$ and $R^2$ each are a residue of an organic diisocyanate. As this organic diisocyanate can be used an aromatic diisocyanate or an aliphatic diisocyanate. Examples of the aromatic diisocyanate include 4,4'-diphenylmethane diisocyanate, 4,4'-diphenyl ether diisocyanate, 1,5-naphthyl diisocyanate, 2,6-tolylene diisocyanate, 2,4-tolylene diisocyanate, naphthalene diisocyanate, 1-methoxyphenyl 2,4-diisocyanate, 3,3'-dimethoxy-4,4'-diphenylmethane diisocyanate, 4,4'-diphenyl ether diisocyanate, 3,3'-dimethyl-4,4'-diphenyl ether diisocyanate, 2,2-bis[4-(4-isocyanatophenoxy)phenyl] hexafluoropropane, and 2,2-bis[4-(4-isocyanatophenoxy) phenyl] propane.

Examples of the aliphatic diisocyanate include hexamethylene diisocyanate, dodecamethylene diisocyanate, 2,2,4-trimethylhexamethylene diisocyanate, 4,4'-dicyclohexylmethane diisocyanate, xylylene diisocyanate, tetramethylxylylene diisocyanate, isophorone diisocyanate, cyclohexyl diisocyanate, lysine diisocyanate, and methylcyclohexane 2,4-diisocyanate.

Especially preferred of those organic diisocyanates are tolylene diisocyanate, 4,4'-diphenylmethane diisocyanate, and 1,5-naphthyl diisocyanate.

Those diisocyanates may be used alone or as a mixture of two or more thereof.

(Organic Monoisocyanate)

It is preferred that the organic monoisocyanate having an $R^4$ group in the molecule be added in a final, middle, or initial stage of the polycarbodiimide-forming reaction or throughout the reaction to conduct the end blocking treatment. The end-blocked polycarbodiimide copolymer gives a solution having excellent storage stability. Examples of the organic monoisocyanate to be used for the end blocking treatment include phenyl isocyanate, p-nitrophenyl isocyanate, p- and m-tolyl isocyanates, p-formylphenyl isocyanate, p-isopropylphenyl isocyanate, and 1-naphthyl isocyanate. Especially preferred is 1-naphthyl isocyanate, because this organic monoisocyanate does not react with itself and the end-blocking reaction of the polycarbodiimide with this monoisocyanate proceeds efficiently. It is preferred that the monoisocyanate for this end blocking be used in an amount in the range of from 1 to 10 mol per 100 mol of the diisocyanate ingredient used. In case where the monoisocyanate ingredient is used in an amount as small as below 1 mol per 100 mol of the diisocyanate ingredient, there is a possibility that the polycarbodiimide obtained might have too high a molecular weight and a solution of the polymer might undergo a viscosity increase or solidification due to a crosslinking reaction. Namely, this polycarbodiimide solution might have considerably reduced storage stability. In case where the monoisocyanate ingredient is used in an amount exceeding 10 mol per 100 mol of the diisocyanate ingredient, the polycarbodiimide solution obtained has too low a viscosity and, hence, there is a possibility that applying and drying the solution might give an unsatisfactory film.

The reactions for polyamide formation and carbodiimide formation are conducted at a temperature of preferably from 40 to 150° C., more preferably from 50 to 140° C. Reaction temperatures lower than 40° C. are impractical because too long a reaction time is necessary. On the other hand, reaction temperatures exceeding 150° C. are undesirable because solvent selection is difficult.

The concentration of the diisocyanate monomer in the reaction mixture may be from 5 to 80% by weight (hereinafter referred to simply as %). When the monomer concentration is lower than 5%, there are cases where the carbodiimide-forming reaction does not proceed. In case where the concentration thereof exceeds 80%, there is a possibility that reaction control might be difficult.

The concentration of the organic diisocyanate in the reaction mixture is preferably from 5 to 80% by weight (hereinafter referred to simply as %). When the concentration thereof is lower than 5%, there are cases where the carbodiimide-forming reaction does not proceed. In case where the concentration thereof exceeds 80%, there is a possibility that reaction control might be difficult.

A solvent is used for producing the polycarbodiimide and an organic solvent is used in preparing a polycarbodiimide solution. These solvents may be known ones. Examples thereof include halogenated hydrocarbons such as tetrachloroethylene, 1,2-dichloroethane, and chloroform, ketone solvents such as acetone, methyl ethyl ketone, methyl isobutyl ketone, and cyclohexanone, cyclic ether solvents such as tetrahydrofuran and dioxane, and aromatic hydrocarbon solvents such as toluene and xylene. These solvents may be used alone or as a mixture of two or more thereof.

As the catalyst for carbodiimide formation, any of known phosphorus compound catalysts may be advantageously used. For example, use can be made of phospholene oxides such as 1-phenyl-2-phospholene 1-oxide, 3-methyl-2-phospholene 1-oxide, 1-ethyl-2-phospholene 1-oxide, 3-methyl-1-phenyl-2-phospholene 1-oxide, and 3-phospholene isomers of these.

After completion of the carbodiimide-forming reaction, the monomers remaining unreacted and the catalyst may be removed by pouring the reaction mixture into a poor solvent such as methanol, ethanol, isopropyl alcohol, or hexane to precipitate the polycarbodiimide.

In preparing a polycarbodiimide solution, the polymer precipitated is washed and dried in a given manner and then dissolved again in an organic solvent. By performing this operation, the polycarbodiimide solution can have improved solution stability.

The polymer solution may be purified by adsorbing byproducts contained therein onto, e.g., an appropriate adsorbent. Examples of the adsorbent include alumina gel, silica gel, activated carbon, zeolites, activated magnesium oxide, activated bauxite, Fuller's earth, activated clay, and molecular sieve carbon. These may be used alone or in combination of two or more thereof.

(Production of Adhesive Film)

The adhesive film to be used in the invention can be produced, for example, in the following manner. A polycarbodiimide copolymer varnish such as that described above is formed into a film having an appropriate thickness by a known technique (e.g., casting, spin coating, or roll coating). After the film formation, the wet coating film is usually heated at a temperature necessary for solvent removal.

For example, in the case where a polycarbodiimide copolymer is used as a material for the adhesive film, the drying temperature is, for example, from 20 to 350° C., preferably from 50 to 250° C., most preferably from 70 to 200° C., so as to dry the coating film while preventing a curing reaction from proceeding too highly. The drying period is, for example, from 30 seconds to 30 minutes, preferably from 1 to 10 minutes, most preferably from 2 to 5 minutes. Drying temperatures lower than 20° C. are undesirable because the solvent remains in the film to impair the reliability of the film. Drying temperatures higher than 350° C. are undesirable because the thermal curing of the film is apt to proceed. Drying periods shorter than 30 seconds are undesirable because the solvent remains in the film to impair the reliability of the film. Drying periods longer than 30 minutes are undesirable because the thermal curing of the film proceeds.

In producing the adhesive film, a fine inorganic filler may be incorporated as long as this incorporation does not impair the processability and heat resistance of the film. Any of various additives for imparting surface smoothness, such as smoothing agents, leveling agents, and defoamers, may also be added according to need. The amount of these ingredients to be incorporated may be from 0.1 to 100 parts by weight, preferably from 0.2 to 50 parts by weight, per 100 parts by weight of the copolymer.

For improving adhesive force, various additives such as, e.g., a silane coupling agent, titanate coupling agent, nonionic surfactant, fluorochemical surfactan, and silicone surfactant may be added to the adhesive film according to need.

In producing the adhesive film, one or more of various insulating inorganic powdery materials, such as ceramics, e.g., silica and silicon nitride, carbon, and the like, may be incorporated for the purpose of improving thermal conductivity, regulating the modulus of elasticity, etc.

The release film preferably is one which withstands the heat and pressure to be applied thereto in laminating the adhesive film to a substrate and which can be peeled from the adhesive film without causing a residue of the adhesive film to remain on the release film.

As such a material can be used a plastic film which has undergone a releasability-imparting treatment with, e.g., a known release agent such as a silicone, long-chain alkyl, fluorochemical, or aliphatic amide compound or silica. Examples of the plastic film include poly(ethylene terephthalate) films, polyester films, poly(vinyl chloride) films, polycarbonate films, polyimide films, fluororesin films, e.g., polytetrafluoroethylene films, polypropylene films, and polyethylene films.

The thickness of the release film is not particularly limited. For example, it is preferably from 10 to 200 μm, more preferably from 20 to 15 μm.

A release film may be disposed on each side of the adhesive film. When this adhesive film is used, the release film on one side is peeled from the adhesive film and this exposed side of the adhesive film is laminated to the bump-possessing side of a substrate. The disposition of a release film on each side is advantageous in that the adhesion of dust particles and the like can be prevented with higher certainty.

The invention will be explained below in more detail by reference to Example and Comparative Examples.

EXAMPLE (Production of Polycarbodiimide)

Into a 500-mL four-necked flask equipped with a stirrer, dropping funnel, reflux condenser, and thermometer were introduced 10.5 g (60 mmol) of tolylene diisocyanate (isomer mixture; Takenate 80, manufactured by Mitsui-Takeda Chemical), 15.0 g (60 mmol) of naphthalene diisocyanate, 86.1 g of a liquid polybutadiene-acrylonitrile copolymer (Hycar-CTBN1300X13, manufactured by B.F. Goodrich), and 232 g of toluene. These ingredients were mixed together. This mixture was stirred at 50° C. for 1 hour. Thereto were added 8.32 g (49.2 mmol) of 1-naphthyl isocyanate and 0.46 g (2.4 mmol) of 3-methyl-1-phenyl-2-phospholene 2-oxide. The resultant mixture was heated to 100° C. with stirring and then held for further 2 hours. The synthesis was wholly conducted in a nitrogen stream, and the progress of reactions was ascertained by infrared spectroscopy (FT/IR-230, manufactured by JEOL Ltd.). Specifically, the decrease in the amount of absorption by N—C—O stretching vibration attributable to the isocyanates (2,270 cm$^{-1}$), the increase in the amount of absorption by N—C—N stretching vibration attributable to carbodiimide (2,135 cm$^{-1}$), and the increase in the amount of absorption by C—O stretching vibration attributable to the C—O in each linking amide group (1,695 cm$^{-1}$) were followed to thereby ascertain the progress and end point of each reaction. Thereafter, the reaction mixture was cooled to room temperature. Thus, a polycarbodiimide solution (1) as a material for an adhesive film was obtained.

(Production of Semiconductor Device)

The polycarbodiimide solution (1) was used to form an adhesive film, which was laminated to a substrate having solder bumps to produce a semiconductor device with reinforced solder bumps.

Specifically, the device was produced in the following manner. The polycarbodiimide solution thus obtained was applied with a laminator (coating speed, 1 m/min; drying temperatures, 130° C. for 1 minute and 150° C. for 1 minute) to a release film (thickness, 50 μm) consisting of a poly (ethylene terephthalate) film treated with a release agent to thereby obtain an adhesive film having a thickness of 50 μm. This adhesive film, after having been cured at 175° C. for 5 hours and separated from the release film, had a modulus of elasticity (−55° C.) of 2.1 GPa.

The adhesive film (uncured film) was laminated to a substrate having a solder bump diameter of 300 μm, bump height of 270 μm, bump pitch of 500 μm, bump population density of 1,000 bumps per chip, and chip size of 6 mm by 6 mm with a roller (temperature, 70° C.; pressure, 25 g/bump) at a speed of 10 cm/min. Thus, a semiconductor device with adhesive film-reinforced solder bumps was obtained. The release film was removed from the semiconductor device obtained. This semiconductor device was placed on a circuit board and mounted thereon by reflow.

(Test)

This semiconductor device was subjected to a TCT test (−55° C.×30 min/125° C.×30 min)

(Results)

In the TCT test, no connection failure occurred in 1,000 cycles. After the 1,000 cycles, sections of the solder bump junctions were examined. As a result, no large crack causative of an open was observed.

Comparative Example 1

A semiconductor device was produced in the same manner as in Example, except that no adhesive film was laminated to the substrate. This semiconductor device was subjected to the same TCT test.

(Results)

As a result of the TCT test, the resistivity increased in 200 cycles, indicating that a connection failure occurred. After the connection failure occurrence, sections of the solder bump junctions were examined. As a result, it was found that a large crack had been developed at the root of a solder bump.

Comparative Example 2

(Production of Carbodiimide)

Into a 500-mL four-necked flask equipped with a stirrer, dropping funnel, reflux condenser, and thermometer were introduced 140 g (803.88 mmol) of tolylene diisocyanate (the same as described above), 140 g (47.54 mmol) of a polyhexamethylene carbonate diol (UH-CARB300, manufactured by Ube Industries), and 290 g of toluene. This mixture was stirred at 50° C. for 30 minutes to conduct urethane formation. Thereafter, the resultant solution was cooled to 40° C. To this solution were added 5.44 g (32.16 mmol) of 1-naphthyl isocyanate and 1.236 g (6.43 mmol) of 3-methyl-1-phenyl-2-phospholene 1-oxide. The resultant mixture was heated to 100° C. with stirring and then held for further 2 hours. The synthesis was wholly conducted in a nitrogen stream, and the progress of reactions was ascertained by infrared spectroscopy (FT/IR-230, manufactured by JEOL Ltd.). Specifically, the decrease in the amount of absorption by N—C—O stretching vibration attributable to the isocyanates (2,270 $cm^{-1}$), the increase in the amount of absorption by N—C—N stretching vibration attributable to carbodiimide (2,135 $cm^{-1}$), and the increase in the amount of absorption by C—O stretching vibration attributable to the C—O in each linking amide group (1,695 $cm^{-1}$) were followed to thereby ascertain the progress and end point of each reaction. Thereafter, the reaction mixture was cooled to room temperature. Thus, a polycarbodiimide solution (2) as a material for an adhesive film was obtained.

A semiconductor device was produced in the same manner as in Example, except that the polycarbodiimide solution (2) was used. This semiconductor device was subjected to the same TCT test.

The adhesive film formed from the polycarbodiimide solution (2) had a modulus of elasticity (−55° C.) of 10.0 GPa.

(Results)

As a result of the TCT test, the resistivity increased in 300 cycles, indicating that a connection failure occurred. After the connection failure occurrence, sections of the solder bump junctions were examined. As a result, it was found that a large crack had been developed at the root of a solder bump.

Comparative Example 3

A semiconductor device was produced in the same manner as in Example, except that the thickness of the adhesive film was changed to 200 μm (74% of the solder bump height). This semiconductor device was placed on a circuit board and subjected to reflow.

(Results)

The adhesive film inhibited the connection between the solver bumps and the circuit board electrodes, and this mounting operation resulted in positional shifting with respect to the bonding of the solder bumps to the circuit board electrodes. Consequently, the semiconductor device mounted had areas where no electrical connection had been obtained.

As described above, according to the process for semiconductor device production of the invention, the reliability of connection with bumps can be easily heightened with higher certainty.

While the invention has been described in detail and with reference to specific embodiments thereof, it will be apparent to one skilled in the art that various changes and modifications can be made therein without departing from the scope thereof.

This application is based on Japanese patent application No. 2002-366910 filed Dec. 18, 2002, the entire contents thereof being hereby incorporated by reference.

What is claimed is:

1. A process for producing a semiconductor device comprising a substrate having bumps formed thereon, which comprises covering a bump-possessing substrate on the bump side with an adhesive film which has a modulus of elasticity at −55° C. of from 100 MPa to 5 GPa and has a thickness of from 5 to 40% of the height of the bumps, and then disposing the adhesive film on the substrate so that the bumps pierce through the adhesive film and come to protrude therefrom.

2. The process for producing a semiconductor device of claim 1, wherein the adhesive film comprises a thermosetting resin composition.

3. The process for producing a semiconductor device of claim 2, wherein the thermosetting resin composition is a polycarbodiimide resin composition.

4. The process for producing a semiconductor device of claim 2, wherein the adhesive film is to be cured simultaneously with the mounting of the semiconductor device on a circuit board by the reflow of the bumps.

5. The process for producing a semiconductor device of claim 3, wherein the adhesive film is to be cured simultaneously with the mounting of the semiconductor device on a circuit board by the reflow of the bumps.

* * * * *